US009082885B2

(12) United States Patent
Yukimori et al.

(10) Patent No.: US 9,082,885 B2
(45) Date of Patent: Jul. 14, 2015

(54) SEMICONDUCTOR CHIP BONDING APPARATUS AND METHOD OF FORMING SEMICONDUCTOR DEVICE USING THE SAME

(71) Applicant: Samsung Electronics Co., Ltd., Suwon-si (KR)

(72) Inventors: Yoshiaki Yukimori, Yokohama (JP); Shinji Ueyama, Yokohama (JP); Masato Kajinami, Yokohama (JP)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/283,238

(22) Filed: May 21, 2014

(65) Prior Publication Data

US 2015/0024551 A1 Jan. 22, 2015

(30) Foreign Application Priority Data

May 30, 2013 (JP) ................................. 2013-114702
Apr. 15, 2014 (KR) ........................ 10-2014-0044565

(51) Int. Cl.
*H01L 21/00* (2006.01)
*H01L 23/00* (2006.01)
*H01L 21/78* (2006.01)
*H01L 21/56* (2006.01)

(52) U.S. Cl.
CPC .............. *H01L 24/93* (2013.01); *H01L 21/561* (2013.01); *H01L 21/78* (2013.01); *H01L 24/83* (2013.01); *H01L 2224/83091* (2013.01); *H01L 2224/83121* (2013.01); *H01L 2224/83203* (2013.01)

(58) Field of Classification Search
CPC ........ H01L 21/561; H01L 21/78; H01L 24/93
See application file for complete search history.

(56) References Cited

U.S. PATENT DOCUMENTS

| 6,596,561 | B2 | 7/2003 | Takahashi et al. |
| 6,632,711 | B2 | 10/2003 | Sugano et al. |
| 6,693,258 | B2 | 2/2004 | Sugano et al. |
| 6,723,583 | B2 | 4/2004 | Takahashi et al. |
| 6,872,597 | B2 | 3/2005 | Takahashi et al. |

(Continued)

FOREIGN PATENT DOCUMENTS

| EP | 2390903 A1 | 11/2011 |
| JP | 08-264543 | 10/1996 |

(Continued)

*Primary Examiner* — Richard Booth
(74) *Attorney, Agent, or Firm* — Muir Patent Law, PLLC

(57) ABSTRACT

A method of manufacturing a semiconductor device includes: providing a first substrate that includes internal wiring, the first substrate including an array of chip mounting regions that includes a first chip mounting region; placing the first substrate on a first carrier line; providing a first semiconductor chip; placing the first semiconductor chip on a first moveable tray; vertically aligning the first chip mounting region of the first substrate with the first semiconductor chip, and performing initial bonding of the first semiconductor chip to the first chip mounting region of the first substrate; and performing subsequent bonding on the initially-bonded first semiconductor chip and first mounting region of the first substrate, thereby more strongly bonding the first semiconductor chip to the first substrate at the first mounting region. The initial bonding occurs after performing a subsequent bonding of at least one other semiconductor chip on the first substrate.

20 Claims, 11 Drawing Sheets

(56) References Cited

U.S. PATENT DOCUMENTS

| | | |
|---|---|---|
| 6,993,832 B2 | 2/2006 | Yamauchi |
| 7,015,069 B2 | 3/2006 | Takahashi et al. |
| 7,270,258 B2 | 9/2007 | Maki et al. |
| 7,615,870 B2 | 11/2009 | Shibamoto et al. |
| 7,757,930 B2 | 7/2010 | Maki et al. |
| 7,861,912 B2 | 1/2011 | Maki et al. |
| 8,074,868 B2 | 12/2011 | Maki et al. |
| 8,292,159 B2 | 10/2012 | Maki et al. |
| 8,640,943 B2 | 2/2014 | Maki et al. |
| 2001/0006846 A1* | 7/2001 | Cao et al. ............... 438/618 |
| 2003/0009876 A1 | 1/2003 | Yamauchi |
| 2004/0245583 A1 | 12/2004 | Horiuchi et al. |
| 2006/0240640 A1* | 10/2006 | Nesterenko et al. ......... 438/455 |
| 2011/0244636 A1 | 10/2011 | Kondo |
| 2012/0058603 A1 | 3/2012 | Maki et al. |
| 2014/0154838 A1 | 6/2014 | Yoshiaki et al. |

FOREIGN PATENT DOCUMENTS

| | | |
|---|---|---|
| JP | 08-279598 | 10/1996 |
| JP | 09-064094 | 3/1997 |
| JP | 10-233484 | 9/1998 |
| JP | 11-177001 | 7/1999 |
| JP | 2000-216087 | 8/2000 |
| JP | 2000-294602 | 10/2000 |
| JP | 2002-190488 | 7/2002 |
| JP | 2002-359350 | 12/2002 |
| JP | 2002-368040 | 12/2002 |
| JP | 2003-282819 | 10/2003 |
| JP | 2004-031902 | 1/2004 |
| JP | 2004-259866 | 9/2004 |
| JP | 2004-356549 | 12/2004 |
| JP | 2004-363355 | 12/2004 |
| JP | 2005-093838 | 4/2005 |
| JP | 2006-310523 | 11/2006 |
| JP | 2006-352080 | 12/2006 |
| JP | 2008-147510 | 6/2008 |
| JP | 2011-222553 | 11/2011 |
| JP | 2011-222555 | 11/2011 |
| JP | 2014-110392 A | 6/2014 |
| WO | WO 01/52317 A1 | 7/2001 |
| WO | WO 02/071470 A1 | 9/2002 |

* cited by examiner

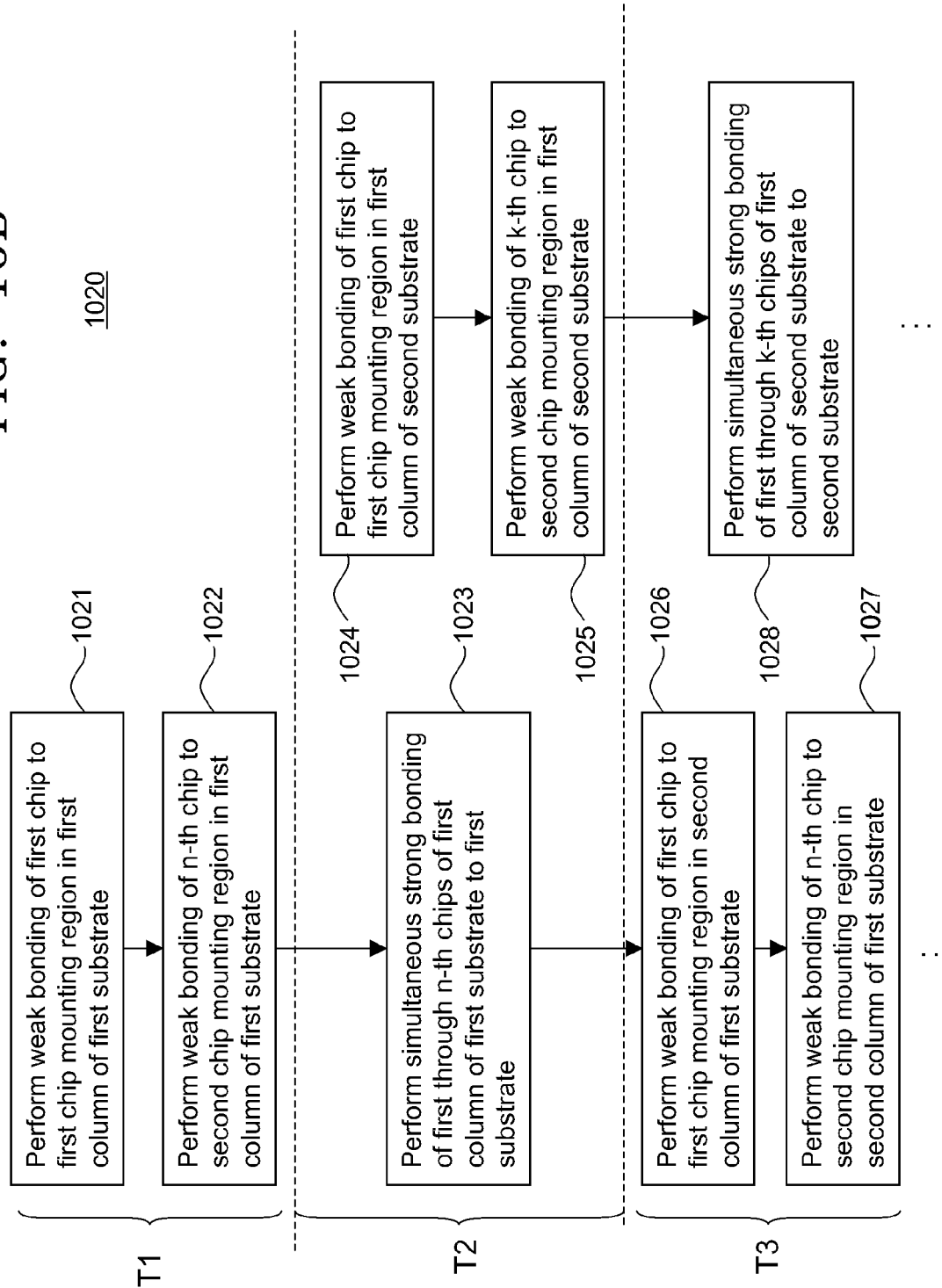

SEMICONDUCTOR CHIP BONDING APPARATUS AND METHOD OF FORMING SEMICONDUCTOR DEVICE USING THE SAME

CROSS-REFERENCE TO RELATED APPLICATIONS

This application claims the benefit of Japanese Patent Application No. 2013-0114702, filed on May 30, 2013, in the Japanese Patent Office and Korean Patent Application No. 10-2014-0044565, filed on Apr. 15, 2014, in the Korean Intellectual Property Office, the disclosures of which are incorporated herein in their entirety by reference.

BACKGROUND

This disclosure relates to a semiconductor chip bonding apparatus and method, and more particularly, to a semiconductor chip bonding apparatus, which is capable of mounting semiconductor chips on wiring substrates.

Integrated circuits formed in semiconductor chips have been more miniaturized. In addition, as electronic products or communication industry products have become smaller, denser, multifunctional and faster, a space for mounting semiconductor chips on a wiring substrate is reduced.

Therefore, a technology for mounting semiconductor chips on a wiring substrate is becoming important. There is a need for a semiconductor chip bonding apparatus that is capable of accurately mounting semiconductor chips to wiring substrates and improving the mounting quality thereof.

SUMMARY

The disclosure provides a semiconductor chip bonding apparatus that implements a method that is capable of improving the mounting accuracy and mounting quality and speed thereof when semiconductor chips are mounted on wiring substrates.

In one embodiment, a method of manufacturing a semiconductor device includes: providing a first substrate that includes internal wiring, the first substrate including an array of chip mounting regions that includes a first chip mounting region; placing the first substrate on a first carrier line; providing a first semiconductor chip; placing the first semiconductor chip on a first moveable tray; positioning the first substrate on the carrier line and positioning the first moveable tray to vertically align the first chip mounting region of the first substrate with the first semiconductor chip; when the first chip mounting region of the first substrate is aligned with the first semiconductor chip, initially bonding the first semiconductor chip to the first chip mounting region of the first substrate; and subsequent to the temporary bonding, performing subsequent bonding on the initially bonded first semiconductor chip and first mounting region of the first substrate, thereby more strongly bonding the first semiconductor chip to the first substrate at the first mounting region. The initial bonding may occur after performing subsequent bonding of at least one other semiconductor chip on the first substrate.

The method may include singulating the bonded first semiconductor chip and first mounting region of the first substrate to form a semiconductor package device, and may further include additionally encapsulating the first semiconductor chip to form the semiconductor package device.

In one embodiment, the method further includes providing a second semiconductor chip; after initially bonding the first semiconductor chip to the first substrate and before performing the subsequent compression of the first semiconductor chip to the first substrate: vertically aligning a second chip mounting region of the first substrate with the second semiconductor chip; and initially bonding the second semiconductor chip to the second chip mounting region of the first substrate; and after initially bonding the second semiconductor chip to the second chip mounting region of the first substrate, performing subsequent bonding on the temporary bonded second semiconductor chip and second mounting region of the first substrate, thereby more strongly bonding the second semiconductor chip to the first substrate at the second mounting region. The subsequent bonding of the initially bonded first semiconductor chip and the subsequent bonding of the initially bonded second semiconductor chip may occur at the same time.

The method may additionally include providing a third semiconductor chip; and after performing the subsequent bonding of the first semiconductor chip and second semiconductor chip to the first substrate: vertically aligning a third chip mounting region of the first substrate with the third semiconductor chip; and initially bonding the third semiconductor chip to the third chip mounting region of the first substrate.

The first and second chip mounting regions of the first substrate may be in a first column of the array, and the third chip mounting region of the first substrate may be in a second column of the array adjacent to the first column.

In one embodiment, the method further includes providing a second substrate that includes internal wiring, the second substrate including an array of chip mounting regions that includes a fourth chip mounting region; placing the second substrate on a second carrier line adjacent the first carrier line; providing a fourth semiconductor chip; initially bonding the fourth semiconductor chip to the fourth chip mounting region of the second substrate at the same time as performing the subsequent bonding of the first and second semiconductor chips; and performing subsequent bonding on the initially bonded fourth semiconductor chip and fourth chip mounting region of the second substrate at the same time as initially bonding the third semiconductor chip to the third chip mounting region of the first substrate.

In one embodiment, the same moveable tray is used to position all four of the first through fourth semiconductor chips on their respective chip mounting regions.

In one embodiment, the method further includes providing a second substrate that includes internal wiring, the second substrate including an array of chip mounting regions that includes a second chip mounting region; placing the second substrate on a second carrier line adjacent the first carrier line; providing a second semiconductor chip; and initially bonding the second semiconductor chip to the second chip mounting region of the second substrate at the same time as performing the subsequent bonding of the first semiconductor chip and the first chip mounting region of the first chip mounting region.

In certain embodiments, a method of manufacturing a semiconductor device includes: providing a first substrate that includes internal wiring, the first substrate including an array of chip mounting regions that includes a first column including a plurality of first chip mounting regions; providing a plurality of first semiconductor chips and at least one second semiconductor chip; performing a first weak bonding step of bonding each of the plurality of first semiconductor chips to a respective first chip mounting region, the bond having a first strength; subsequent to the first weak bonding step, performing strong bonding on the weak bonded plurality of first semiconductor chips and their respective first mounting regions simultaneously, thereby more strongly bonding each of the plurality of first semiconductor chips to the first substrate; and subsequent to performing the strong bonding on the plurality of first semiconductor chips, performing a second weak bonding step of weak bonding the at least one second semiconductor chip to at least one respective second chip mounting region of the first substrate.

The method may include singulating one of the first bonded semiconductor chips and its respective mounting region of the first substrate to form a semiconductor package device.

In one embodiment, the method includes: providing a second substrate that includes internal wiring, the second substrate including an array of chip mounting regions that includes a third chip mounting region; providing a third semiconductor chip; and weak bonding the third semiconductor chip to the third chip mounting region of the second substrate at the same time as performing the strong bonding of the plurality of first semiconductor chips.

In one embodiment, a same moveable tray is used to position all of the first through third semiconductor chips on their respective chip mounting regions.

The method may further include, for each of the first semiconductor chips, weak bonding the first semiconductor chip to its respective first chip mounting region by positioning a chip tray connected to the first semiconductor chip to align the first chip with the respective first chip mounting area, wherein the first substrate is positioned along a first carrier line to perform the aligning.

The at least one second semiconductor chip may include a plurality of second semiconductor chips, and performing the second weak bonding step may include weak bonding the plurality of second semiconductor chips to a plurality of respective second chip mounting regions of the first substrate arranged in a second column of the array.

In yet another embodiment, a method of manufacturing a semiconductor device includes: providing a first substrate that includes internal wiring, the first substrate including an array of chip mounting regions that includes a first column including a plurality of first chip mounting regions, and a second column including a plurality of second chip mounting regions; providing a plurality of first semiconductor chips and a plurality of second semiconductor chips; performing a first bonding step causing each of the plurality of first semiconductor chips to bond on their respective first chip mounting regions, the bond having a first bond strength; subsequent to the first bonding step, performing a second bonding step on each of the first-bonded plurality of first semiconductor chips simultaneously, thereby causing each of the plurality of first semiconductor chips to bond with a second bond strength on their respective first chip mounting regions, the second bond strength stronger than the first bond strength; and subsequent to performing the second bonding step on the plurality of first-bonded semiconductor chips, performing a third bonding step causing each of the plurality of second semiconductor chips to bond on their respective second chip mounting regions, the bond having the first bond strength.

In one embodiment, first bonding step may bond each of the plurality of first semiconductor chips to the first substrate at a respective first chip mounting region, and the third bonding step may bond each of the plurality of second semiconductor chips to the first substrate at a respective second chip mounting region.

In another embodiment, the first bonding step may bond each of the plurality of first semiconductor chips to a lower semiconductor chip at a respective first chip mounting region, and the third bonding step may bond each of the plurality of second semiconductor chips to a lower semiconductor chip at a respective second chip mounting region.

In one embodiment, the first bond strength is caused by the first bonding step occurring for a first period of time, and the second bond strength is caused the second bonding step occurring for a second period of time longer than the first period of time.

In one embodiment, the method includes singulating one of the first second-bonded semiconductor chips and its respective mounting region of the first substrate to form a semiconductor package device.

BRIEF DESCRIPTION OF THE DRAWINGS

Exemplary embodiments will be more clearly understood from the following detailed description taken in conjunction with the accompanying drawings in which:

FIGS. 10A and 10B depict an exemplary method of forming a semiconductor device according to certain embodiments.

DETAILED DESCRIPTION

Figure 1:
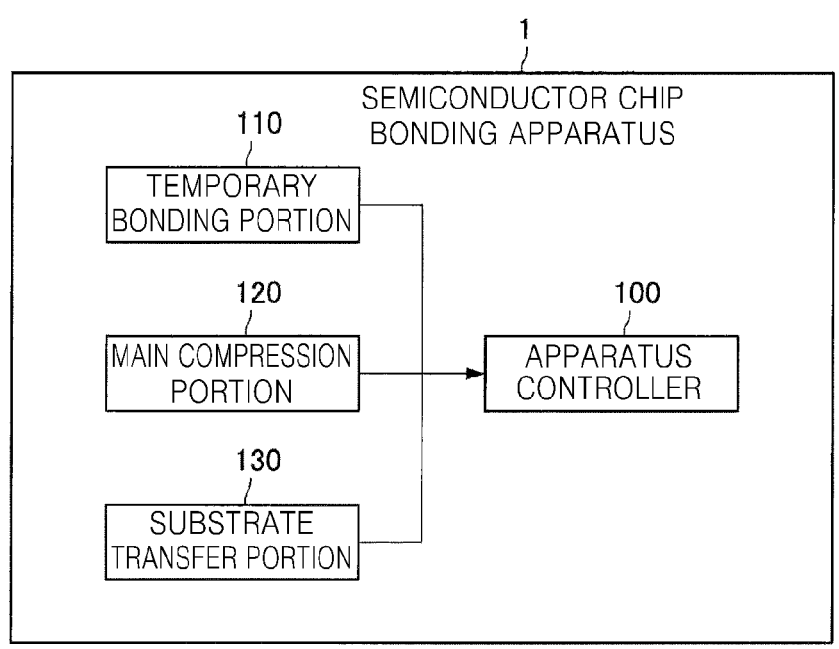
FIG. 1 is a block diagram illustrating the configuration and function of a semiconductor chip bonding apparatus according to one embodiment.

Hereinafter, various exemplary embodiments will be described with reference to the accompanying drawings. The inventive concept may, however, be embodied in many different forms and should not be construed as being limited to the embodiments set forth herein. The inventive concept is to cover all modifications, equivalents, and alternatives falling within the spirit and scope of the disclosed embodiments.

Like reference numerals denote like elements throughout the specification and drawings. In the drawings, the dimensions of structures are exaggerated for clarity. As used herein, the term "and/or" includes any and all combinations of one or more of the associated listed items. Further, as used herein, the singular forms "a", "an", and "the" are intended to include the plural forms as well, unless the context clearly indicates otherwise.

It will be understood that when an element, such as a layer, a region, or a substrate, is referred to as being "on," "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present.

Also, though terms like a first and a second are used to describe various members, components, regions, layers, and/or portions in various embodiments of the inventive concept, the members, components, regions, layers, and/or portions are not limited to these terms. Unless the context indicates otherwise, these terms are used only as a naming convention to differentiate one member, component, region, layer, or portion from another one. Therefore, a member, a component, a region, a layer, or a portion referred to as a first member, a first component, a first region, a first layer, or a first portion in an embodiment can be referred to as a second member, a second component, a second region, a second layer, or a second portion in another embodiment.

Spatially relative terms, such as "above," "upper," "beneath," "below," "lower," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" may encompass both an orientation of above and below. The device may be otherwise oriented (rotated 90 degrees or at other orientations) and the spatially relative descriptors used herein interpreted accordingly.

It will be understood that terms such as "comprise", "include", and "have", when used herein, specify the presence of stated features, integers, steps, operations, elements, components, or combinations thereof, but do not preclude the presence or addition of one or more other features, integers, steps, operations, elements, components, or combinations thereof. Expressions such as "at least one of," when preceding a list of elements, modify the entire list of elements and do not modify the individual elements of the list.

Configuration and Function of a Semiconductor Chip Bonding Apparatus According to Certain Exemplary Embodiments FIG. 1 is a block diagram illustrating the configuration and function of a semiconductor chip bonding apparatus 1 according to an exemplary embodiment.

The semiconductor chip bonding apparatus 1 according to this embodiment includes an apparatus controller 100, a temporary bonding portion 110, a main compression portion 120, and a substrate transfer portion 130.

The temporary bonding portion 110 may be a portion that arranges a plurality of semiconductor chips at a plurality of semiconductor chip mounting positions of a wiring substrate (or a circuit substrate) and performs thermocompression bonding thereon. The temporary bonding portion 110 determine positions of semiconductor chips and arrange the semiconductor chips at semiconductor chip mounting positions of a wiring substrate.

In this specification, the term "wiring substrate" may refer, for example, to a substrate in which a plurality of semiconductor chip mounting positions are set in a single printed circuit board (PCB) and internal wirings are formed thereon. In the wiring substrate, the semiconductor chip mounting positions may be set in a matrix, or array, arrangement. Therefore, the wiring substrate may also be referred to as a matrix substrate or an array substrate. The wiring substrate may be a substrate on which a plurality of semiconductor chips are to be mounted. A plurality of semiconductor packages may be obtained by singulating the plurality of semiconductor chips formed on the wiring substrate.

The temporary bonding portion 110 may take semiconductor chips accommodated in a chip tray, arrange the semiconductor chips at semiconductor chip mounting positions set in a predetermined region of the wiring substrate, and thermocompression-bond the semiconductor chips to the wiring substrate by heating and pressurization.

In one embodiment, the thermocompression bonding in the temporary bonding portion 110 may be performed in a shorter time than main compression to be described below. The semiconductor chips arranged on the wiring substrate by the thermocompression bonding are bonded to the wiring substrate by a bonding force enough to prevent the semiconductor chips from being misaligned by the transfer of the wiring substrate, or the like. In this specification, such bonding is referred to as "temporary bonding," "preliminary bonding," "initial bonding," or "weak bonding."

The main compression portion 120 may be a portion that performs thermocompression bonding such that the temporary-bonded semiconductor chips are metal-bonded to the wiring substrate at the same time. The main compression portion 120 may simultaneously heat and pressurize the semiconductor chips, which are temporary-bonded to the predetermined region by the temporary bonding portion 110, and perform thermocompression bonding to metal-bond the semiconductor chips to the wiring substrate. The main compression portion 120 may be a portion that mechanically and electrically bonds the semiconductor chips, which are temporary-bonded to the predetermined region by the temporary bonding portion 110, at the same time. The temporary bonding and main-compression may include bonding of the same adhesive materials, wherein the temporary bonding process includes weakly bonding the adhesive material to the substrate, and the main-compression process includes strongly bonding the adhesive material to the substrate.

In one embodiment, the thermocompression bonding in the main compression portion 120 may be performed in a longer time than the above-described temporary bonding. The semiconductor chips, which are main-compressed on the wiring substrate by the thermocompression bonding, may be electrically connected to the wiring substrate and be mechanically tightly bonded to the wiring substrate. In this specification, such bonding is referred to as "main compression," "primary compression," "subsequent bonding," "final bonding," or "strong bonding."

As described above, the semiconductor chip mounting positions may be defined in the predetermined region of the wiring substrate. In the wiring substrate in which the semiconductor chip mounting positions are set in a matrix arrangement, a predetermined region may be a single column or multiple columns of the matrix, or may be a part of a single column of the matrix. The predetermined region may be a region formed, for example, by a plurality of rows and a plurality of columns in the above-described matrix arrangement. The predetermined region may be a region that includes only one semiconductor chip mounting position.

The substrate transfer portion 130 may reciprocate and transfer the wiring substrate between the temporary bonding portion 110 and the main compression portion 120. The substrate transfer portion 130 may transfer the substrate, to which the semiconductor chips are temporary-bonded by the temporary bonding portion 110, to the main compression portion 120. The substrate transfer portion 130 may transfer the substrate, to which the semiconductor chips are main-compressed by the main compression portion 120, to the temporary bonding portion 110. Furthermore, the substrate transfer portion 130 may include a plurality of carrier (transfer) lines each of which is capable of transferring the wiring substrates. In this case, each of the plurality of carrier lines may independently transfer the wiring substrates.

The substrate transfer portion 130 may be driven, for example, by a linear motor, a ball screw, or a timing belt to transfer the wiring substrates. Since a transfer position of the wiring substrate may need to be controlled in units of micrometers ($\mu$m), the substrate transfer portion 130 may be driven using a linear motor having a $\mu$m-scale position determination precision.

The apparatus controller 100 may control the overall operation of the semiconductor chip bonding apparatus 1. The apparatus controller 100 may control the overall operation of the semiconductor chip bonding apparatus 1 by performing the above-described operations in the temporary bonding portion 110, the main compression portion 120, and the substrate transfer portion 130. The apparatus controller 100 may perform the overall operation of the semiconductor chip bonding apparatus 1, for example, by a hardware configuration, such as a central processing unit (CPU), a read only memory (ROM), a random access memory (RAM), and various external memory devices. The ROM may store a program for controlling the temporary bonding portion 110, the main compression portion 120, and the substrate transfer portion 130. The CPU may read the program from the ROM to perform the overall operation of the semiconductor chip bonding apparatus 1.

The configuration of the semiconductor chip bonding apparatus 1 according to one embodiment has been described above. Due to the above-described configuration, the semiconductor chip bonding apparatus 1 according to this embodiment may repetitively perform a temporary bonding process by the temporary bonding portion 110 and a main compression process by the main compression portion 120 with respect to the wiring substrate.

Specifically, the semiconductor chip bonding apparatus 1 according to one embodiment may temporary-bond semiconductor chips to only semiconductor chip mounting portions of a first predetermined region in the temporary bonding portion 110, and main-compress the semiconductor chips that are temporary-bonded within the first predetermined region.

The semiconductor chip bonding apparatus 1 may repetitively perform a process of temporary-bonding semiconductor chips at semiconductor chip mounting positions within a second predetermined region different from the first predetermined region, and a process of main-compressing the semiconductor chips that are temporary-bonded within the second predetermined region.

Therefore, in the semiconductor chip bonding apparatus 1 according to one embodiment, when the main compression is performed on the semiconductor chips that are temporary-bonded within the first predetermined region, semiconductor chips being in the process of the temporary bonding are not present on the wiring substrate, and only semiconductor chips to be main-compressed are present on the wiring substrate.

As a result, in the semiconductor chip bonding apparatus 1 according to one embodiment, even when heat generated during the main compression is transferred to a surrounding area, the semiconductor chips may not be misaligned because the semiconductor chips being in the process of the temporary bonding are not present in the surrounding area. Therefore, the semiconductor chip bonding apparatus 1 according to this embodiment may improve the mounting accuracy and mounting quality of the semiconductor chips.

The semiconductor chip bonding apparatus 1 according to certain embodiments may use a thermoplastic adhesive or a thermosetting adhesive as an adhesive for bonding the semiconductor chips to the wiring substrate.

Specifically, in a case where the thermoplastic adhesive is used to bond the semiconductor chips to the wiring substrate, the semiconductor chips being in the temporary bonding state may be misaligned if heat generated during the main compression is transferred to the surrounding area and thus the thermoplastic adhesive is melted. In addition, in a case where the thermosetting adhesive is used to bond the semiconductor chips to the wiring substrate, contact failure may occur if heat generated during the main compression is transferred to the surrounding area and thus the thermosetting adhesive is hardened.

However, the semiconductor chip bonding apparatus 1 according to the embodiment described above may avoid the above-described problems by preventing the influence of heat transferred during the main compression. Therefore, the semiconductor chip bonding apparatus 1 according to certain embodiments may perform the bonding of the semiconductor chips using the thermoplastic adhesive or the thermosetting adhesive.

Figure 2:
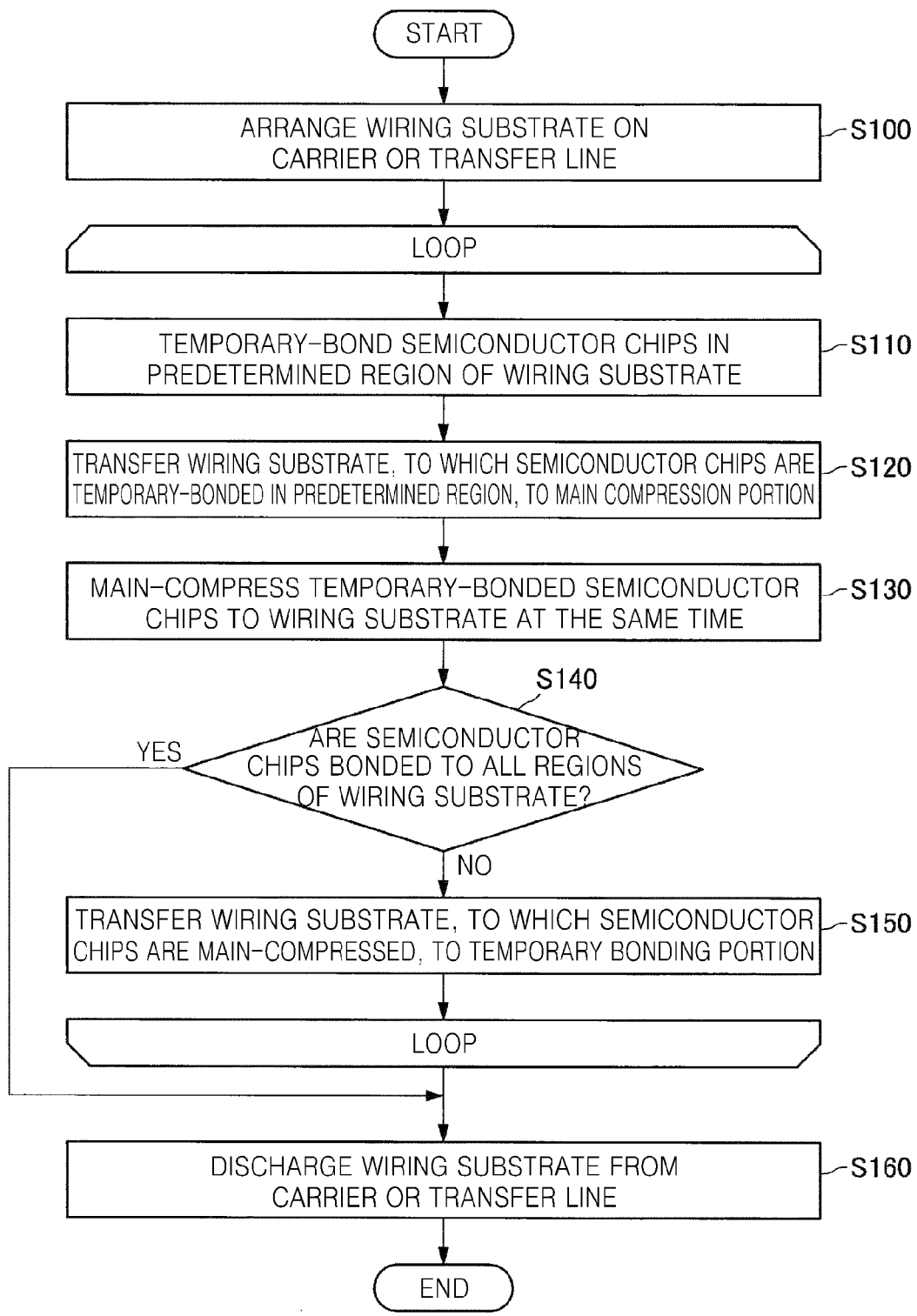
FIG. 2 is a flowchart illustrating an exemplary operation of a semiconductor chip bonding apparatus according to one embodiment.

Operation of the Semiconductor Chip Bonding Apparatus According to Exemplary Embodiments FIG. 2 is a flowchart illustrating the operation of a semiconductor chip bonding apparatus according to certain exemplary embodiments.

The semiconductor chip bonding apparatus 1 according to the embodiment of FIG. 2 arranges a wiring substrate, to which no semiconductor chips are bonded, on a carrier (transfer) line of the substrate transfer portion 130 (S100). The substrate transfer portion 130 transfers the wiring substrate to the temporary bonding portion 110, and the temperature compression bonding portion 110 temporary-bonds semiconductor chips at semiconductor chip mounting portions within a predetermined region of the wiring substrate (S110). The substrate transfer portion 130 transfers the wiring substrate, to which the semiconductor chips are temporary-bonded within the predetermined region by the temporary bonding portion 110, to the main compression portion 120 (S120). The main compression portion 120 main-compresses the semiconductor chips, which are temporary-bonded to the wiring substrate in operation S110, to the wiring substrate (S130).

The apparatus controller 100 determines whether the semiconductor chips are bonded to all semiconductor chip mounting positions of the wiring substrate (S140). When it is determined that the semiconductor chips are not bonded to all semiconductor chip mounting positions of the wiring substrate and non-bonded semiconductor chip mounting positions are present (NO in operation S140), the substrate transfer portion 130 transfers the wiring substrate to the temporary bonding portion 110 (S150). The semiconductor chip bonding apparatus 1 returns to the operation S110 to perform the temporary bonding by the temporary bonding portion 110 and the main compression by the main compression portion 120 (S110 to S130) with respect to the non-bonded semiconductor chip mounting positions.

When it is determined that the semiconductor chips are bonded to all semiconductor chip mounting positions of the wiring substrate (YES in operation S140), the substrate transfer portion 130 discharges the wiring substrate from the carrier line (S160). Therefore, in the semiconductor chip bonding apparatus 1, a wiring substrate, to which next semiconductor chips are to be bonded, may be arranged on the carrier line of the substrate transfer portion 130.

Configuration of a Semiconductor Chip Bonding Apparatus According to Embodiments of Inventive Concept and Configuration of a Semiconductor Chip Bonding Apparatus According to a First Comparative Example The configuration, function, and operation of the semiconductor chip bonding apparatus 1 according to one embodiment have been described. Next, while comparing with the semiconductor chip bonding apparatus 2 according to the first comparative example, a detailed configuration of the semiconductor chip bonding apparatus 1 according to certain embodiments will be described below with reference to FIGS. 3, 4, 7 and 8.

Figure 7:
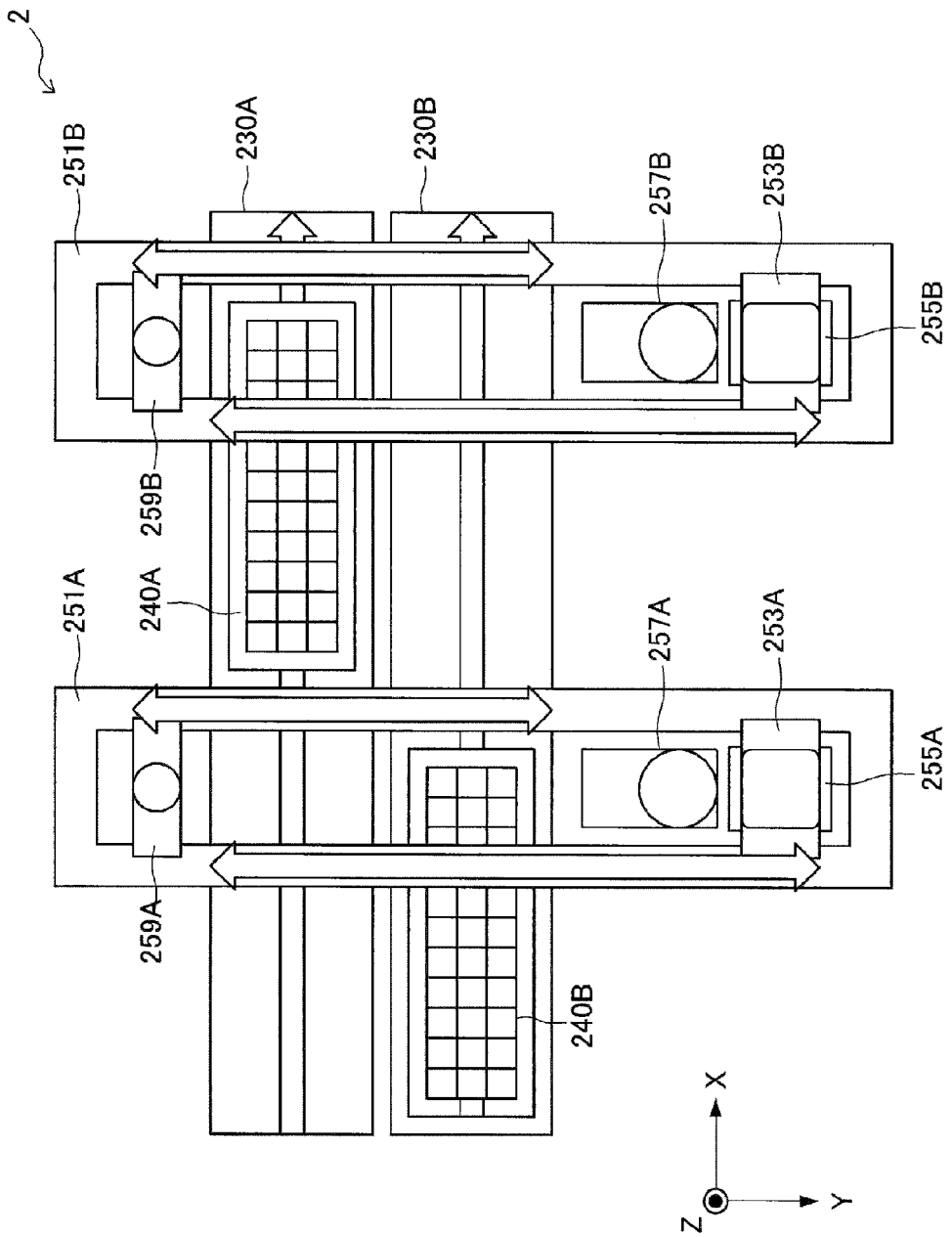
FIG. 7 is a plan view illustrating a configuration example of a semiconductor chip bonding apparatus according to a first comparative example.
Figure 8:
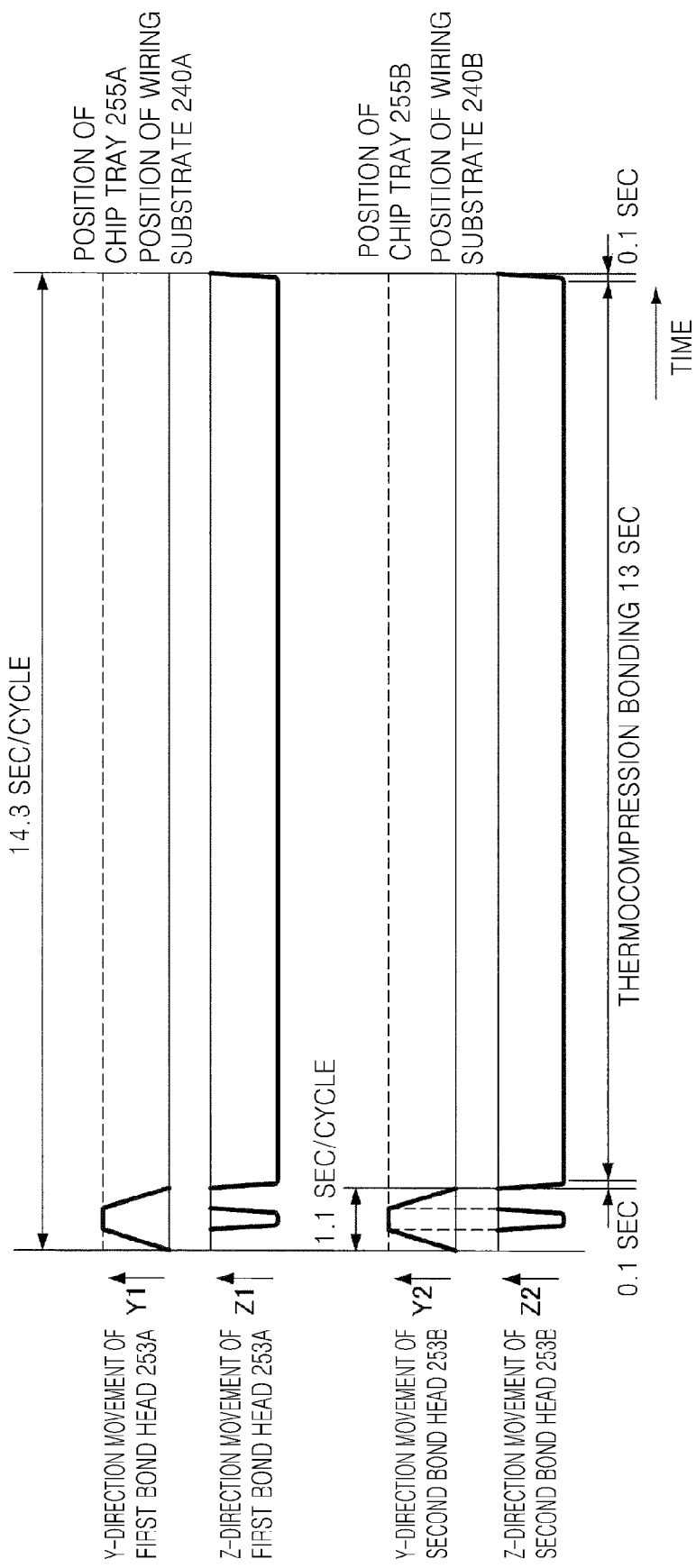
FIG. 8 is a timing chart illustrating an example of Y- and Z-direction movements of first and second bond heads according to the first comparative example.

Configuration Example of a Semiconductor Chip Bonding Apparatus According to a First Comparative Example FIG. 7 is a plan view illustrating a configuration example of a semiconductor chip bonding apparatus 2 according to a first comparative example, and FIG. 8 is a timing chart illustrating an example of Y- and Z-direction movements of first and second bond heads according to the first comparative example.

First, the configuration example of the semiconductor chip bonding apparatus 2 according to the first comparative example will be described below with reference to the plan view of FIG. 7. The semiconductor chip bonding apparatus 2 according to the first comparative example is an apparatus for bonding semiconductor chips to a wiring substrate one by one so as to prevent the semiconductor chips from being misaligned by the transfer of heat during the main compression as described above. As illustrated in FIG. 7, the semiconductor chip bonding apparatus 2 according to the first comparative example includes two carrier lines each transferring the wiring substrate, and two gantries each including a main compress head for bonding the semiconductor chip.

The semiconductor chip bonding apparatus 2 according to the first comparative example is an apparatus for bonding semiconductor chips, which are accommodated in first and second chip trays (first and second chip cassettes) 255A and 255B, to wiring substrates 240A and 240B. The semiconductor chip bonding apparatus 2 includes first and second gantries 251A and 251B, first and second bond heads 253A and 253B, first and second chip cameras 257A and 257B, first and second place cameras 259A and 259B, and first and second carrier lines 230A and 230B.

The first and second bond heads 253A and 253B may be movable in the Y direction and the Z direction illustrated in FIG. 7. The first and second bond heads 253A and 253B adsorb and transfer the semiconductor chips accommodated in the first and second chip trays 255A and 255B, and bond the semiconductor chips to the wiring substrates 240A and 240B by thermocompression bonding. Examples of the semiconductor chips accommodated in the first and second chip trays 255A and 255B may include flip chips to be mounted with principal (major) surfaces facing the wiring substrates.

The first and second gantries 251A and 251B, also referred to herein as slide structures, or rail structures, may be structures for freely moving the first and second bond heads 253A and 253B and the first and second place cameras 259A and 259B in the Y direction. The first and second carrier lines 230A and 230B may transfer the wiring substrates 240A and 240B in the X direction.

The first and second chip cameras 257A and 257B are image pickup devices that capture coordinates and slopes of the semiconductor chips, which are adsorbed onto the first and second bond heads 253A and 253B, from a side opposite to an adsorption surface (for example, viewed from below the bottom). The first and second chip cameras 257A and 257B capture the coordinates and slopes of the adsorbed semiconductor chips when the first and second bond heads 253A and 253B pass over the first and second chip cameras 257 and 257B.

The first and second place cameras 259A and 259B move over the first and second gantries 251A and 251B in the Y direction and capture the semiconductor chip mounting positions of the wiring substrates 240A and 240B. The first and second bond heads 253A and 253B correct the bonding positions of the semiconductor chips, based on the coordinates and slopes of the semiconductor chips that are captured by the first and second chip cameras 257A and 257B, and the semiconductor chip mounting positions of the wiring substrates 240A and 240B that are captured by the first and second place cameras 259A and 259B.

Next, the operation of the semiconductor chip bonding apparatus 2 according to the first comparative example will be described below with reference to FIG. 8.

FIG. 8 depicts a timing chart illustrating an example of Y- and Z-direction movements of the first and second bond heads 253A and 253B according to the first comparative example. "Y1" and "Y2" coordinate directions in FIG. 8 are identical to the "Y" coordinate direction in FIG. 7, and "Z1" and "Z2" coordinate directions in FIG. 8 are identical to the "Z" coordinate direction in FIG. 7.

The first and second bond heads 253A and 253B are waiting at home positions, that is, the wiring substrates 240A and 240B. As illustrated in FIG. 8, when the bonding of the semiconductor chips to the wiring substrates is started, the first and second bond heads 253A and 253B move down to the first and second chip trays 255A and 255B and adsorb the semiconductor chips, and the first and second bond heads 253A and 253B return back to the wiring substrates 240A and 240B. This reciprocating time is, for example, 1.1 second.

Then, the first and second bond heads 253A and 253B move up or down in 0.1 second and performs thermocompression bonding on the adsorbed semiconductor chips. The time required for the thermocompression bonding is, for example, 13 seconds. Therefore, the time required for bonding until the first and second bond heads 253A and 253B adsorb a single semiconductor chip from the first and second chip trays 255A and 255B and finish the thermocompression bonding is 14.3 seconds.

In FIG. 8, the first and second bond heads 253A and 253B start the bonding process at the same time, but may perform the bonding process independently.

Therefore, for example, when the wiring substrates 240A and 240B have 5×14 semiconductor chip mounting positions, the time required when the semiconductor chip bonding apparatus 2 according to the first comparative example, which has been described above with reference to FIGS. 7 and 8, bonds a single semiconductor chip to the wiring substrate may be calculated as 14.38 seconds by using Equations 1 and 2 below. In this case, the time required for replacing the wiring substrates 240A and 240B was set as 5 seconds.

$$14.3(\text{seconds/chip}) \times 70(\text{chips}) + 5(\text{seconds}) = 1,006(\text{seconds}) \quad [\text{Equation 1}]$$

In Equation 1 above, 14.3 seconds are the time required for the thermocompression bonding of the semiconductor chip, 70 chips are the number of chips mounted on the wiring substrate when the wiring substrate has 5×14 semiconductor chip mounting positions, 5 seconds are the time required for replacing the wiring substrate, and 1,006 seconds are the time required for the thermocompression bonding of the semiconductor chip to the single wiring substrate.

$$1{,}006(\text{seconds}) \div 70(\text{chips}) = 14.38(\text{seconds/chip}) \quad [\text{Equation 2}]$$

In Equation 2 above, the time required for the thermocompression bonding of the single semiconductor chip is 14.38 seconds.

Furthermore, the number of semiconductor chips that are bondable in one hour by the semiconductor chip bonding apparatus 2 according to the first comparative example, which has been described above with reference to FIGS. 7 and 8, may be calculated as 500 chips by using Equations 3 and 4 below.

$$3{,}600(\text{seconds}) \div 14.38(\text{seconds/chip}) = 250(\text{chips}) \quad [\text{Equation 3}]$$

In Equation 3, as can be seen from the result obtained by dividing 3,600 seconds (one hour) by 14.38 seconds, which are the time required for the thermocompression bonding per semiconductor chip, about 250 semiconductor chips may be thermocompression-bonded in one hour.

$$250(\text{chips/gantry}) \times 2(\text{gantries}) = 500(\text{chips}) \quad [\text{Equation 4}]$$

In Equation 4 above, when about 250 semiconductor chips are thermocompression-bonded in one hour, two gantries may thermocompression-bond about 500 semiconductor chips in one hour.

The semiconductor chip bonding apparatus 2 according to the first comparative example performs the process of bonding the semiconductor chips to the wiring substrates in a one-step bonding process, without dividing the bonding process into the temporary bonding process and the main compression process. Therefore, it is possible to prevent the semiconductor chips from being misaligned by the transfer of heat generated during the main compression to the adjacent semiconductor chips being in the process of the temporary bonding. However, the semiconductor chip bonding apparatus 2 according to the first comparative example performs the thermocompression bonding process that uses time-consuming heating and pressurization. Therefore, the number of semiconductor chips that are bondable per unit time is significantly reduced and the productivity of the semiconductor chip bonding apparatus 2 is low.

To improve the productivity of the semiconductor chip bonding apparatus 2 according to the first comparative example, additional gantries and additional carrier lines may be further provided, or two or more main compress heads may be provided in each gantry. However, such configuration for improving the productivity of the semiconductor chip bonding apparatus 2 is substantially the same as the installation of a plurality of semiconductor chip bonding apparatuses 2. Hence, the manufacturing cost and the apparatus size are increased.

As described above, the semiconductor chip bonding apparatus 2 according to the first comparative example may prevent the adjacent semiconductor chips from being misaligned by the transfer of heat, but has low productivity because the semiconductor chip bonding apparatus 2 performs the process of bonding the semiconductor chips to the wiring substrates, without dividing the bonding process into the temporary bonding and the main compression process.

Configuration Example of a Semiconductor Chip Bonding Apparatus According to One Embodiment The semiconductor chip bonding apparatus 1 according to one embodiment, which has been made by the close examination during trials by the inventors of the present application, remarkably improves the productivity while preventing the adjacent semiconductor chips from being misaligned in the process of the temporary bonding by the transfer of heat generated during the main compression. A detailed configuration example of the semiconductor chip bonding apparatus 1 according to this embodiment is described below with reference to FIGS. 3 and 4.

Figure 3:
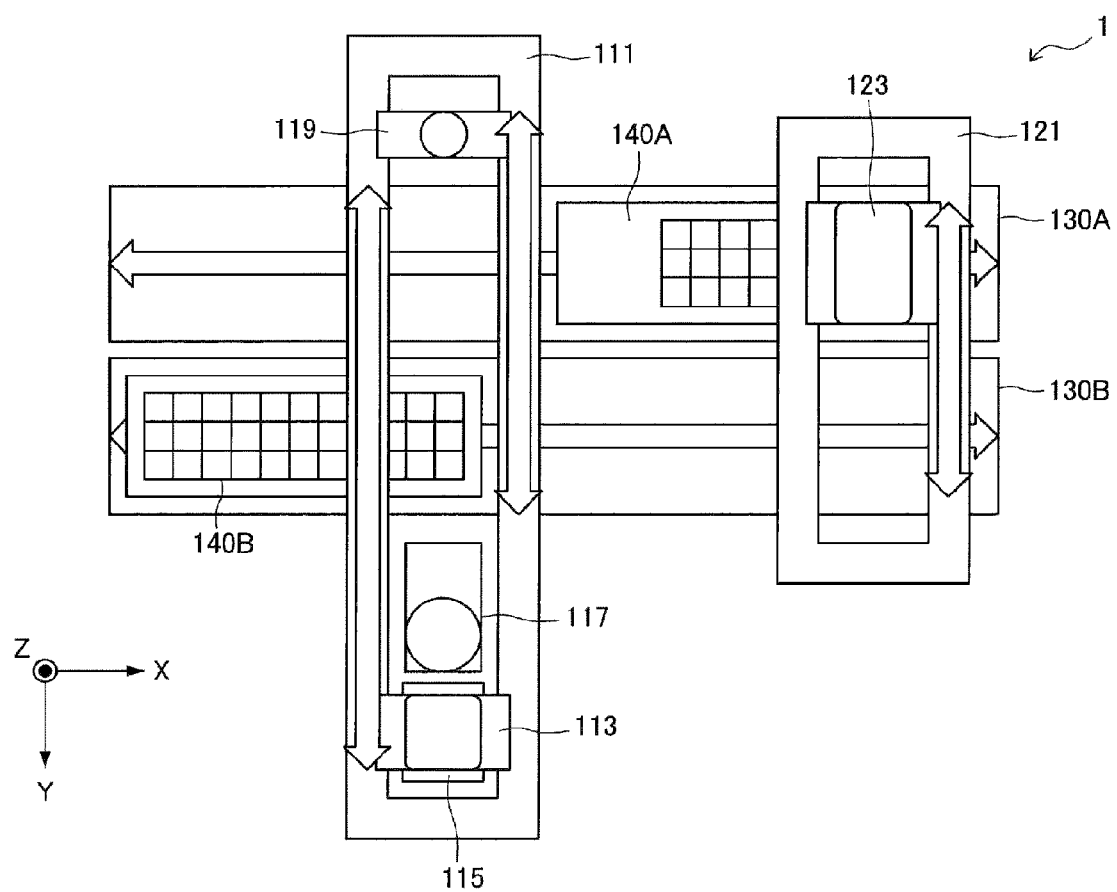
FIG. 3 is a plan view illustrating an exemplary configuration of a semiconductor chip bonding apparatus according to one embodiment.

FIG. 3 is a plan view illustrating the configuration example of the semiconductor chip bonding apparatus 1 according to one exemplary embodiment.

Referring to FIG. 3, the semiconductor chip bonding apparatus 1 according to one embodiment includes a substrate transfer portion, a temporary bonding portion, and a main compression portion. The substrate transfer portion may include a plurality of carrier lines (for example, two carrier lines) that transfer wiring substrates. The temporary bonding portion may include a gantry (e.g., a supporter or a support portion) with a temporary bond head that temporary-bonds semiconductor chips. The main compression portion may include a gantry with a main compress head that main-compresses the temporary-bonded semiconductor chips.

The semiconductor chip bonding apparatus 1 according to this embodiment is an apparatus for bonding semiconductor chips, which are accommodated in a chip tray (chip cassette) 115, to wiring substrates 140A and 140B. The semiconductor chip bonding apparatus 1 may include a temporary bond gantry 111, a temporary bond head 113, a chip camera 117, a place camera 119, a main compress gantry 121, and a main compress head 123, and first and second carrier lines 130A and 130B.

The substrate transfer portion may include a plurality of carrier lines each transferring wiring substrates in the X direction (first direction). The temporary bonding portion may include the temporary bond gantry 111 disposed on the substrate transfer portion in the Y direction (second direction) perpendicular to the X direction. The temporary bond head 113 of the temporary bonding portion may be movable in the Y direction and the Z direction illustrated in FIG. 3. The temporary bond head 113 of the temporary bonding portion may adsorb semiconductor chips accommodated in the chip tray 115 or the like, transfer the semiconductor chips in the Y direction, and temporary-bond the semiconductor chips to the wiring substrates 140A and 140B, for example, by thermocompression bonding. In one embodiment, the heating and pressurization time of the thermocompression bonding performed by the temporary bond head 113 is shorter than that of the thermocompression bonding performed by the main compress head 123 to be described below.

Due to such a configuration, the temporary bond head 113 may bond the semiconductor chips to the wiring substrates 140A and 140B by a bonding force enough to prevent misalignment between the semiconductor chips and the wiring substrates 140A and 140B. As in the case of the first comparative example, the semiconductor chips, which are accommodated in the chip tray 115 or the like, may be flip chips to be mounted with principal (major) surfaces facing the wiring substrates. For example, bumps, balls, or pillars on a surface of the flip chip may be bonded to pads, bumps, balls, or pillars or other external terminals of the wiring substrate during weak bonding and strong bonding steps.

The main compression portion may include the main compress gantry 121 disposed on the substrate transfer portion apart from the temporary bond gantry 111 in the Y direction perpendicular to the X direction. The main compress head 123 of the main compression portion may be movable in the Y direction and the Z direction illustrated in FIG. 3 and may main-compress the semiconductor chips, which are temporary-bonded on the wiring substrates 140A and 140B, at the same time by thermocompression bonding.

The heating and pressurization time of the thermocompression bonding performed by the main compress head 123 is longer than that of the thermocompression bonding performed by the temporary bond head 113. Due to such a configuration, the main compress head 123 forms a metal bonding to electrically bond the temporary-bonded semiconductor chips to the wiring substrates 140A and 140B. Therefore, the bonding becomes more mechanically tight.

The main compress head 123 may main-compress the semiconductor chips that are temporary-bonded on the wiring substrates 140A and 140B at the same time. For example, in the wiring substrates 140A and 140B in which the semiconductor chip mounting positions are set in the matrix arrangement, the unit by which the main compress head 123 performs the main compression may be a single column or multiple columns of the matrix arrangement, or may be a part of a single column of the matrix arrangement. In the matrix arrangement, the unit by which the main compress head 123 performs the main compression may be a region defined by "multiple rows×multiple columns". The unit by which the main compress head 123 performs the main compression may be a region having only one semiconductor chip mounting position.

The temporary bond gantry 111 may be a structure that includes a temporary bond head 113 and a place camera 119, and moves the temporary bond head 113 and the place camera 119 in the Y direction. The main compress gantry 121 may be a structure that includes a main compress head 123, and moves the main compress head 123 in the Y direction.

The first and second carrier lines 130A and 130B may reciprocate and transfer the wiring substrates 140A and 140B in the X direction. The first and second carrier lines 130A and 130B may reciprocate the wiring substrates 140A and 140B between the temporary bond head 113 and the main compress head 123.

The chip camera 117 is an image pickup device that captures coordinates and slopes of the semiconductor chips, which are adsorbed onto the temporary bond head 113, from a side opposite to an adsorption surface (that is, viewed from below the bottom). The chip camera 117 captures the coordinates and slopes of the adsorbed semiconductor chips when the temporary bond head 113 passes directly over the chip camera 117.

The place camera 119 is moved in the Y direction over the temporary bond gantry 111 to capture the semiconductor chip mounting positions of the wiring substrates 140A and 140B. The chip camera 117 corrects the bonding positions of the semiconductor chips, based on the coordinates and slopes of the semiconductor chips that are captured by the chip camera 117, and the semiconductor chip mounting positions of the wiring substrates 140A and 140B that are captured by the place camera.

Figure 4:
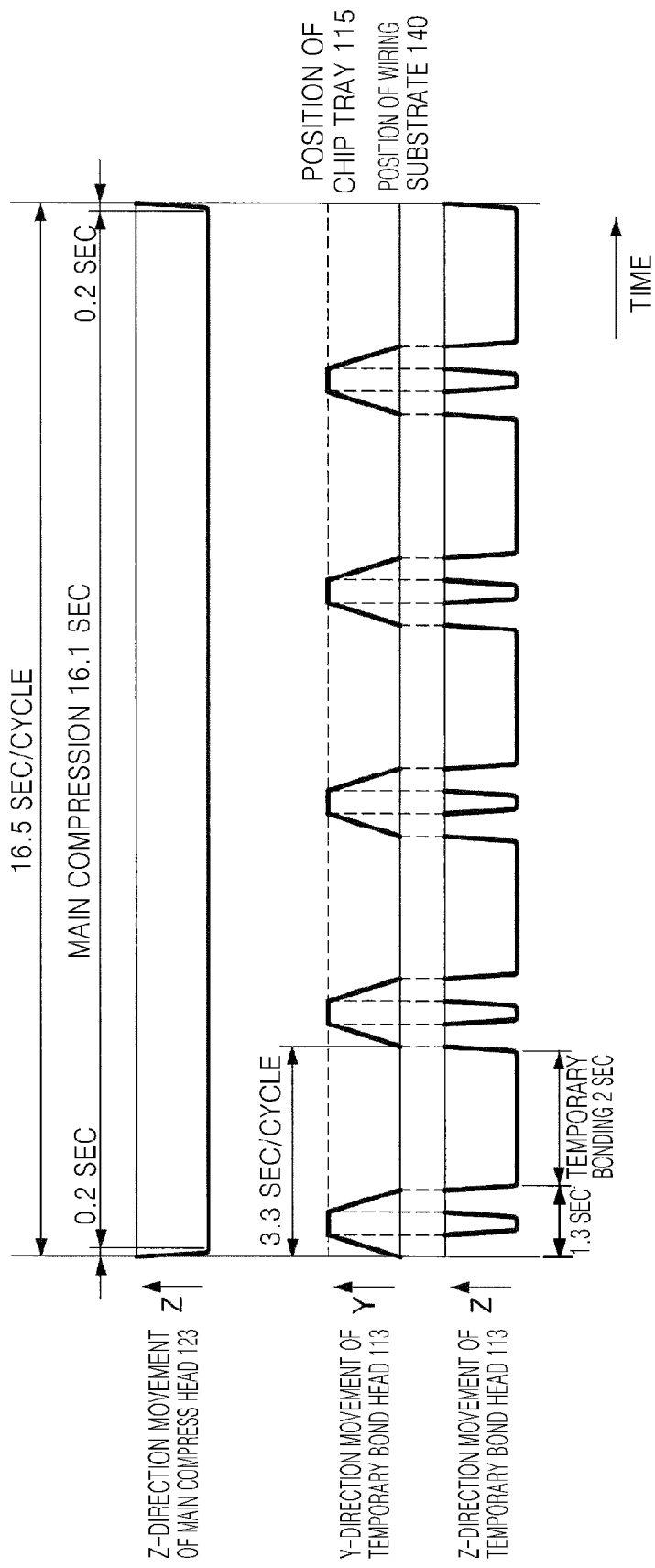
FIG. 4 is a timing chart illustrating an example of Y- and Z-direction movements of a temporary bond head and a main compress head according to certain embodiments.

Next, the operation of the semiconductor chip bonding apparatus 1 according to one exemplary embodiment will be described below with reference to FIG. 4. FIG. 4 is a timing chart illustrating an example of Y- and Z-direction movements of the temporary bond head 113 and the main compress head 123 according to one embodiment. The "Y" and "Z" coordinate directions in FIG. 4 are identical to the "Y" and "Z" coordinate directions in FIG. 3.

It is assumed that the wiring substrates 140A and 140B in FIG. 4 have semiconductor chip mounting positions in a 5×14 matrix arrangement. In FIG. 4, it is assumed that semiconductor chips of a first column in the 5×14 matrix arrangement with a predetermined region of the wiring substrate 140A, for example, semiconductor chip mounting positions are temporary-bonded.

As illustrated in FIG. 4, the temporary bond head 113 is waiting at a home position, that is, the wiring substrate 140B. When the bonding of the semiconductor chips to the wiring substrate 140B is started, the temporary bond head 113 moves downward to the chip tray 115, adsorbs the semiconductor chips, and returns back to the wiring substrate 140B. This reciprocating time is, for example, 1.3 second. The temporary bond head 113 performs the temporary bonding on the adsorbed semiconductor chips. The temporary bonding has only to be bonded by a bonding force enough to prevent the semiconductor chips and the wiring substrate 140B from being misaligned by the transfer thereof or the like. Thus, the required time is short, for example, 2 seconds.

Therefore, the time required until the temporary bond head 113 adsorbs a single semiconductor chip from the chip tray 115 and completes the temporary bonding is 3.3 seconds. In addition, by repeating five times the above-described operation, the semiconductor chips of the single column of the 5×14 matrix arrangement including the predetermined region, that is, the semiconductor chip mounting positions, may be temporary-bonded to the wiring substrate 140B.

As illustrated in FIG. 4, the semiconductor chips, which are temporary-bonded to the single column of the 5×14 matrix arrangement including the predetermined region, for example, the semiconductor chip mounting positions, are main-compressed at the same time.

For example, the main compress head 123 may move up or down in 0.2 second to perform the main compression on the five semiconductor chips of the predetermined region at the same time. The main compression is performed on a plurality of semiconductor chips. Therefore, the time required for the main compression is longer than the time required for the bonding performed by the semiconductor chip bonding apparatus 2 according to the first comparative example. The time required for the main compression is, for example, 16.1 seconds. Therefore, the time required for the main compress head 123 to perform the main compression on the five semiconductor chips at the same time is 16.5 seconds.

In the above example, in the semiconductor chip bonding apparatus 1 according to one exemplary embodiment, the main compress head 123 may perform the main compression once for 16.5 seconds, for which the temporary bond head 113 performs five times the temporary bonding. In the semiconductor chip bonding apparatus 1 according to one embodiment, for example, wiring substrates 140A and 140B may be arranged on two carrier lines 130A and 130B, respectively, and the temporary bonding process and the main compression process may be alternately performed on the wiring substrates 140A and 140B.

For example, while the main compress head 123 performs the main compression of the five semiconductor chips to the wiring substrate 140A, the temporary bond head 113 performs the temporary bonding of the five semiconductor chips to the wiring substrate 140B. In addition, as described above, the time required for the main compression of the five semiconductor chips to the wiring substrate 140A is equal to the time required for the temporary bonding of the five semiconductor chips to the wiring substrate 140B. Therefore, the main compression and the temporary bonding are completed at the same time and within the same time period.

In this case, the wiring substrate 140A is transferred to the temporary bond head 113 through the carrier line 130A, and the wiring substrate 140A is transferred to the main compress head 123 through the carrier line 130B. On the contrary, the temporary bond head 113 may perform the temporary bonding of the five semiconductor chips to the wiring substrate 140A, and the main compress head 123 may perform the main compression of the five semiconductor chips to the wiring substrate 140B. As a result, the semiconductor chip bonding apparatus 1 according to certain embodiments concept may always maintain the temporary bond head 113 and the main compress head 123 to be in the operating state, improving the productivity thereof.

Hereinafter, for more clearly describing the productivity of the semiconductor chip bonding apparatus 1 according to certain embodiments, the number of semiconductor chips that are bondable in one hour by the semiconductor chip bonding apparatus 1 according to one embodiment will be calculated in the same case as described in the semiconductor chip bonding apparatus 2 according to the first comparative example.

When the wiring substrates 140A and 140B have 5×14 semiconductor chip mounting positions, the time required when the semiconductor chip bonding apparatus 1, which has been described above with reference to FIGS. 3 and 4, bonds a single semiconductor chip to the wiring substrates is calculated as 3.38 seconds by the following equation. The time required for replacing the wiring substrates 140A and 140B was assumed to be 5 seconds. The time required for the reciprocation of the wiring substrates 140A and 140B between the temporary bond head 113 and the main compress head 123 is short and is finished within the movement time of the temporary bond head 113 and the main compress head 123. Hence, the time required for the reciprocation of the wiring substrates 140A and 140B is not considered in the following calculation.

$$16.5(\text{seconds}) \div 5(\text{chips}) = 3.3(\text{seconds/chip}) \quad \text{[Equation 5]}$$

In Equation 5 above, the time required for the thermocompression including the temporary bonding and the main compression of the five semiconductor chips is 16.5 seconds, and the time required for the thermocompression compression bonding of the single semiconductor chip is 3.3 seconds.

$$3.3(\text{seconds/chip}) \times 70(\text{chips}) + 5(\text{seconds}) = 236(\text{seconds}) \quad \text{[Equation 6]}$$

In Equation 6 above, 3.3 seconds are the time required for the thermocompression bonding of the single semiconductor chip, 70 chips are the number of semiconductor chips mounted on the 5×14 wiring substrate, 5 seconds are the time required for replacing the wiring substrate, and 236 seconds are the time required for the thermocompression bonding of the semiconductor chips to the single wiring substrate.

$$236(\text{seconds}) \div 70(\text{chips}) = 3.38(\text{seconds/chip}) \quad \text{[Equation 7]}$$

In Equation 7 above, the time required for the thermocompression bonding of the single semiconductor chip is 3.38 seconds.

In addition, the number of semiconductor chips that are bondable in one hour by the semiconductor chip bonding apparatus 1, which has been described above with reference to FIGS. 3 and 4, is calculated as 1,065 chips by the following equation.

$$3,600(\text{seconds}) \div 3.38(\text{chips}) 1,065(\text{chips}) \quad \text{[Equation 8]}$$

In Equation 8, as can be seen from the result obtained by dividing 3,600 seconds (one hour) by 3.38 seconds, which are the thermocompression bonding time per a semiconductor chip, about 1,065 semiconductor chips may be thermocompression-bonded.

Therefore, the semiconductor chip bonding apparatus 1 according to certain embodiments may remarkably improve the productivity, without increasing the manufacturing cost or the apparatus size as compared with the semiconductor chip bonding apparatus 2 according to the first comparative example.

Figure 5:
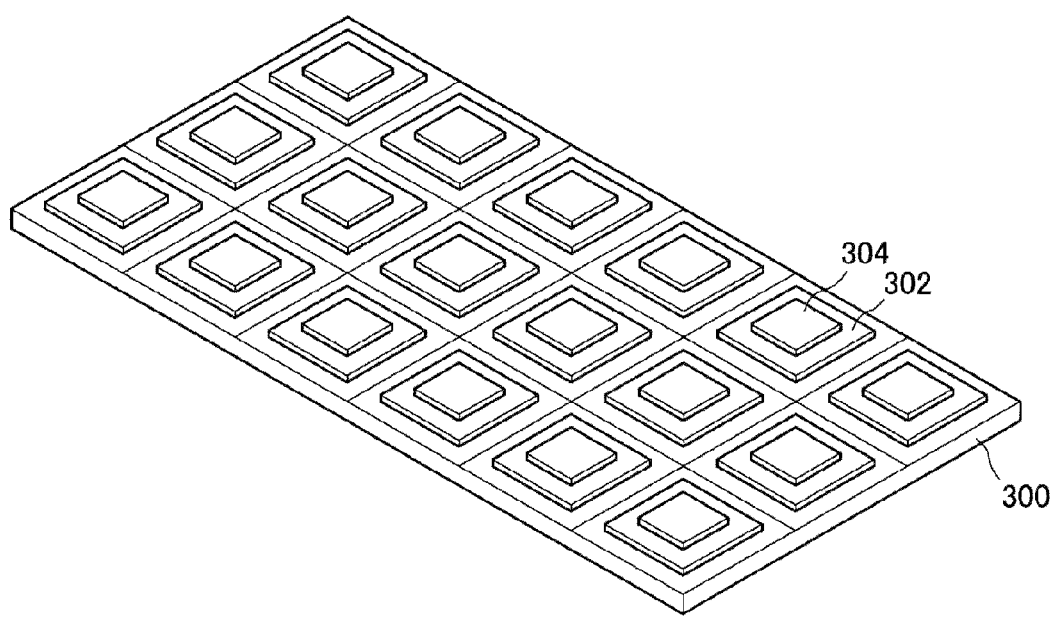
FIG. 5 is a perspective view describing an exemplary three-dimensional mounting of a semiconductor package using the semiconductor chip bonding apparatus according to certain embodiments.
Figure 6:
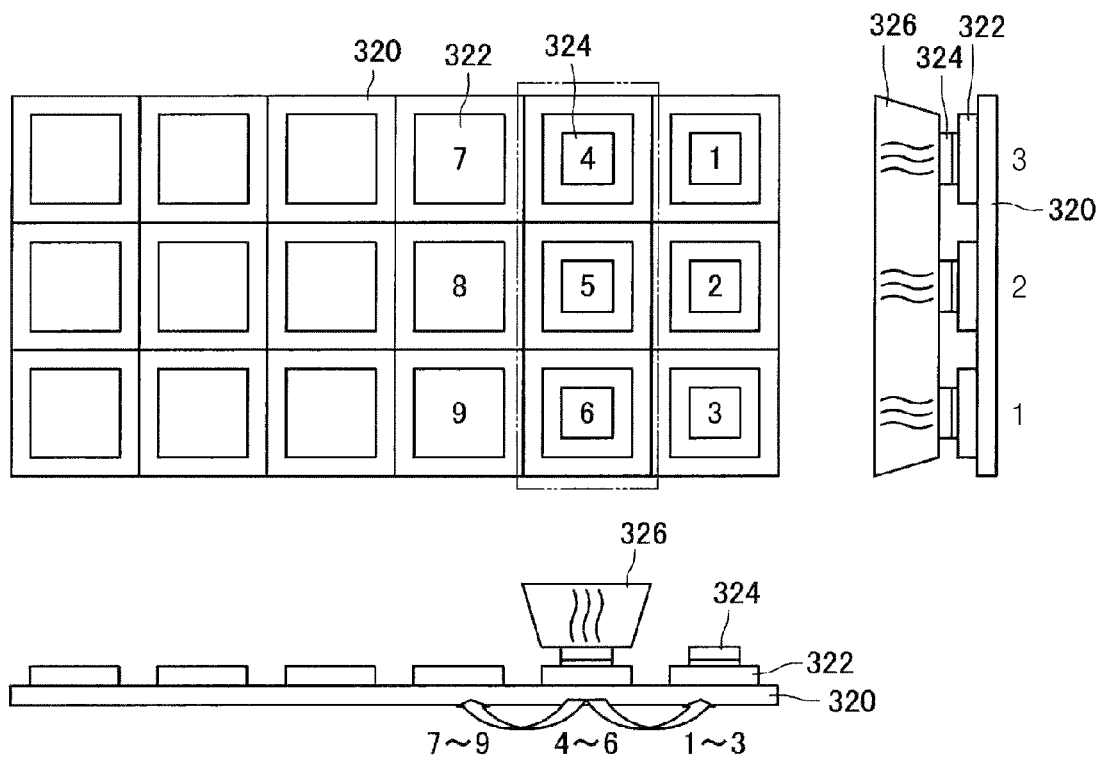
FIG. 6 is a schematic diagram illustrating an exemplary bonding structure of semiconductor chips according to one embodiment.
Figure 9:
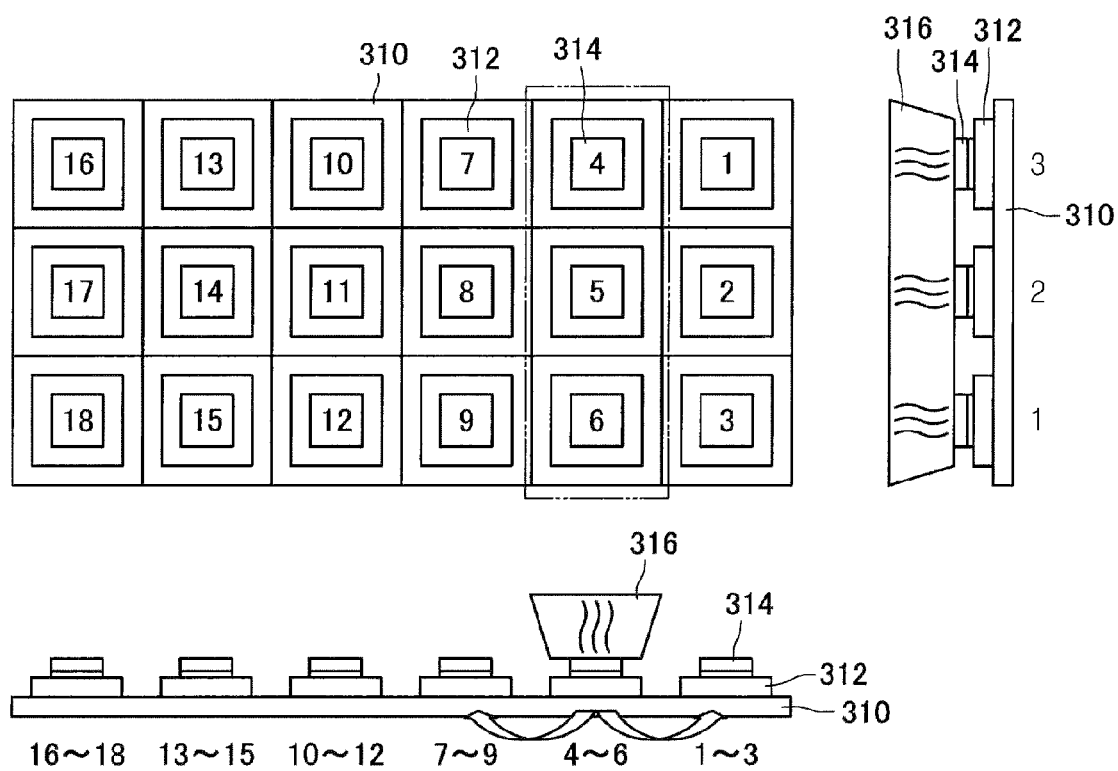
FIG. 9 is a schematic diagram illustrating a bonding structure of semiconductor chips according to a second comparative example.

Application Example of a Semiconductor Chip Bonding Apparatus According to One Embodiment FIG. 5 is a perspective view illustrating a three-dimensional semiconductor package mounting using the semiconductor chip bonding apparatus according to one embodiment, FIG. 6 is a schematic diagram illustrating a bonding structure of semiconductor chips according to this embodiment, and FIG. 9 is a schematic diagram illustrating a bonding structure of semiconductor chips according to a second comparative example.

A method of mounting semiconductor chips and wiring substrates, which may be suitably used by the semiconductor chip bonding apparatus 1 according to certain embodiments, will be described below with reference to FIGS. 5, 6, and 9. The technical idea of the disclosed embodiments are not limited to the above three-dimensional mounting. For example, the technical ideas described in connection with these figures may also be applied for mounting a bottom chip to a wiring substrate, for mounting chips in stacks having more than two chips, or to various other mounting methods.

As illustrated in FIG. 5, the three-dimensional semiconductor chip mounting may be suitably used by the semiconductor chip bonding apparatus 1. As for the three-dimensional mounting, a lower chip 302 is mounted on a wiring substrate 300, and an upper chip 304 is then mounted on the lower chip 302. In the three-dimensional mounting, when the upper chip 304 is mounted, bonding is typically performed for a long time by heating and pressurization.

As illustrated in FIG. 9, in the bonding of the semiconductor chip according to the second comparative example, upper chips 314 are temporary-bonded to all lower chips 312 on the wiring substrate 310, and then, the main compression is performed for each column by the main compress head 316.

Specifically, the temporary bond head temporary-bonds the upper chips 314 to the lower chips 312 on the wiring substrate 310 in order of positions "1" to "18". Then, the main compress head 316 simultaneously performs the main compression on the upper chips 314 over the wiring substrate 310 for position numbers "1" to "3", "4" to "7", and "7" to "9".

For example, when the main compress head 316 main-compresses the temporary-bonded semiconductor chips of the position numbers "4" to "6", heat applied during the main compression is transferred to adjacent semiconductor chips of the position numbers "1" to "3" and "7" to "9". Since the upper chips 314 of the position numbers "1" to "3" have already experienced the main compression and the metal bonding, the transfer of heat does not affect the upper chips 314 of the position numbers "1" to "3".

On the other hand, since the upper chips of the position numbers "7" to "9" are in the process of the temporary bonding, the transfer of heat may cause misalignment in the upper chips 314 of the position numbers "7" to "9" due to melting of adhesives or the like. Therefore, in the bonding of the semiconductor chips according to the second comparative example, as illustrated in FIG. 9, the mounting accuracy of the semiconductor chips may be lowered and the mounting quality may be degraded.

On the other hand, as illustrated in FIG. 6, in the bonding of the semiconductor chips according to this embodiment, upper chips 324 are temporary-bonded to lower chips 322 for each predetermined region (for example, each column) of a wiring substrate 320, and then, the main compression is performed for each column by the main compress head 326.

Specifically, the temporary bond head temporary-bonds the upper chips 324 to the lower chips 322 of the position numbers "1" to "3" on the wiring substrate 320. Then, the main compress head 326 simultaneously performs the main compression on the upper chips 324 of the position numbers "1" to "3" over the wiring substrate 320.

Similarly, the temporary bond head performs the temporary bonding of the upper chips 324 to the lower chips 322 of the position numbers "4" to "6" on the wiring substrate 320, and then, the main compress head 326 performs the main compression on the upper chips 324 at the same time.

For example, when the main compress head 326 performs the main compression on the temporary-bonded upper chips 324 of the position numbers "4" to "6", heat applied during the main compression is transferred to adjacent upper chips of the position numbers "1" to "3" and "7" to "9". Since the upper chips 324 of the position numbers "1" to "3" have already experienced the main compression and the metal bonding, the transfer of heat does not affect the upper chips 324 of the position numbers "1" to "3". In addition, since the upper chips 324 are not present at the position numbers "7" to "9", the transfer of heat has no influence thereon.

Therefore, in the bonding of the semiconductor chips according to this embodiment, as illustrated in FIG. 6, there occurs no misalignment in the upper chips 324 due to melting of adhesives or the like. Therefore, it is possible to improve the mounting accuracy and mounting quality of the semiconductor chips.

Moreover, the bonding of the semiconductor chips according to this embodiment may also be suitably applied to flip chips that are mounted, with principal surfaces facing wiring substrates. The flip chips are heated and pressurized during the bonding to the wiring substrates. Hence, in the second comparative example, as in the three-dimensional mounting, misalignment may occur because heat generated during the main compression is transferred to the adjacent semiconductor chips that are in the process of the temporary bonding.

However, in the bonding of the semiconductor chips according to the above embodiment, the adjacent semiconductor chips are not affected even when heat is transferred during the main compression. Therefore, as in the case of the three-dimensional mounting, the bonding of the semiconductor chips according to one embodiment may improve the mounting accuracy and mounting quality of the semiconductor chips in the flip chips.

For example, even when the thermoplastic adhesive is used like a die attach film method or a non conductive film method, the bonding of the semiconductor chips according to one embodiment of the inventive concept may improve the mounting accuracy and mounting quality of the semiconductor chips in the flip chips. Even when the thermosetting adhesive is used, the bonding of the semiconductor chips according to one embodiment may improve the mounting accuracy and mounting quality of the semiconductor chips.

As described above, when the semiconductor chip bonding apparatus according to various embodiments performs the main compression on the semiconductor chips that are temporary-bonded within the predetermined region, the semiconductor chips being in the process of the temporary bonding are not present on the substrates, except for the semiconductor chips to be subject to the main compression. Therefore, in the semiconductor chip bonding apparatus according to certain embodiments, the semiconductor chips may not be misaligned even when heat is transferred thereto during the main compression, because the semiconductor chips being in the process of the temporary bonding are not present therearound. Therefore, the semiconductor chip bonding apparatus described herein may improve the mounting accuracy and mounting quality of the semiconductor chips.

By arranging wiring substrates on the plurality of carrier lines, respectively, the semiconductor chip bonding apparatus according to the disclosed embodiments may alternately perform the temporary bonding process and the main compression process on the wiring substrates. Therefore, the semiconductor chip bonding apparatus may always maintain the temporary bonding portion and the main compression portion to be in the operating state, and may remarkably improve the productivity, without increasing the manufacturing cost and the apparatus size.

The semiconductor chip bonding apparatus according to the disclosed embodiments may bond the semiconductor chips to the wiring substrate by using, for example, the thermoplastic adhesive or the thermosetting adhesive.

In the flip chip bonding and the three-dimensional mounting, the semiconductor chip bonding apparatus according to the disclosed embodiments of the inventive concept may also be used for bonding that requires a long process time in a bump bonding or an adhesive hardening.

Figure 10A:
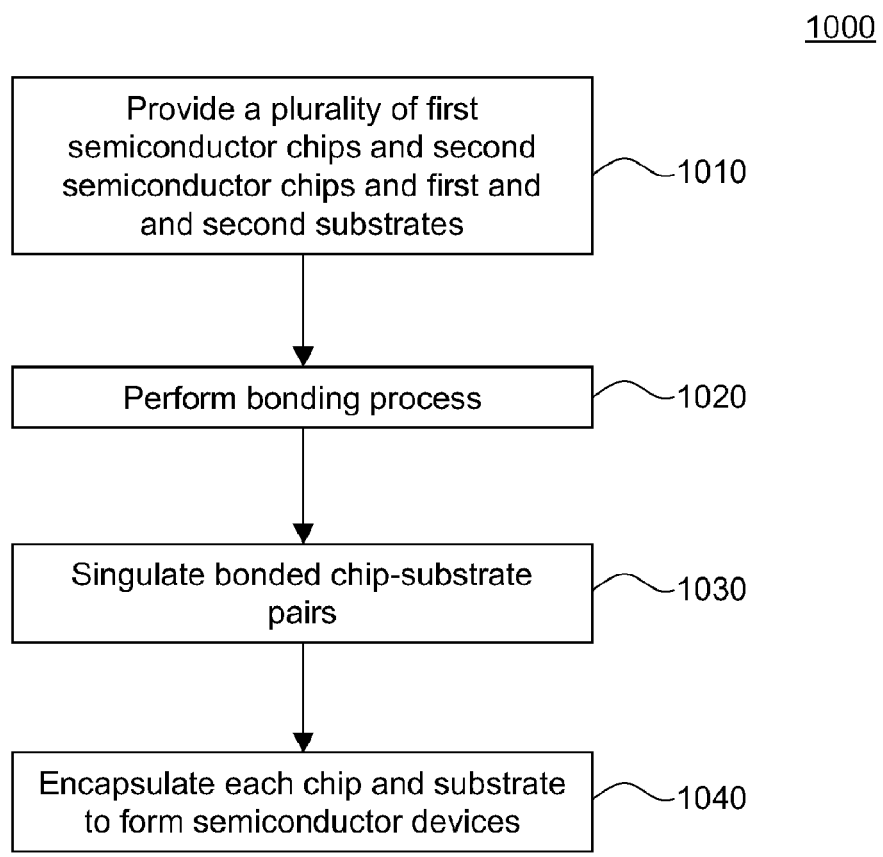

An exemplary method of forming a semiconductor device according to the embodiments described herein is illustrated in FIGS. 10A and 10B. As can be seen in FIG. 10A, a method 1000 of forming a semiconductor device includes providing a plurality of first semiconductor chips and second semiconductor chips and first and second substrates (step 1010). In this step, for example, a plurality of first chips for mounting on a first wiring substrate may be provided, and a plurality of second chips for mounting on a second wiring substrate may be provided.

In step 1020, a bonding process is performed. For example, the bonding process may include one of the exemplary embodiments described above. A more detailed example of this bonding process is shown in FIG. 10B, described below.

In step 1030, after the bonding process is complete, each stack of bonded semiconductor chip and wiring substrate pairs is singulated. For example, for each mounting region of a wiring substrate, which may include one or more bonded semiconductor chips on it, the stack including the substrate for that region and the one of more bonded semiconductor chips is singulated from the overall substrate.

In step 1040, the singulated stack including a substrate and one or more chips stacked and bonded thereon is encapsulated. For example, the encapsulation may include a resin or other protective, insulative material. As a result, a semiconductor device such as a semiconductor package may be formed. Though not shown, one or more additional steps may be included in the formation of the semiconductor devices. For example, testing may be performed prior to encapsulation, and/or other processes may be performed.

Turning back to step 1020, as shown in FIG. 10B, the bonding process 1020 may include two concurrent sub-processes. A first sub-process (including steps 1021, 1022, 1023, 1026, 1027, etc.) may be performed on a first substrate, while a second sub-process (including steps 1024, 1025, 1028, etc.) is performed on a second substrate. Certain steps in the different sub-processes overlap.

For example, as shown in FIG. 10B, in steps 1021 and 1022, a first bonding process, such as weak bonding as described above is performed. First step 1021 includes performing weak bonding for a first chip to a first chip mounting region in a first column of a first substrate. For example, this may be accomplished using first carrier line 130A, temporary bond gantry 111, chip tray 115, and temporary bond head 113, as well as other exemplary elements shown in FIG. 3.

After this step, weak bonding may be performed for additional chips, up to an n-th chip, in respective chip mounting regions of the first column of the first substrate. These steps may occur during time T1.

After weak bonding for the first column is complete, a subsequent step 1023 includes performing simultaneous strong bonding of the first through n-th chips of the first column of the first substrate to the first substrate. As described above, the strong bonding (e.g., main compression) may result in a bond strength that is higher than the weak bonding (e.g., temporary bonding). As shown in the example of FIG. 3, the strong bonding may be performed using first carrier line 130A, main compress gantry 121, and main compress head 123. The strong bonding step 1023 may occur during time T2.

Then, with regard to the first sub-process, additional weak bonding steps are performed for additional chips for a second column of the first substrate (steps 1026, 1027, during T3). This process (e.g., weak bonding for each chip in a column and then strong bonding for all chips in that column simultaneously) may continue until all chips, or all desired chips, are strong-bonded to the first substrate. Also, though a column is given as an example for performing strong bonding, other groupings, such as multiple columns, pairs, or other arrangements of semiconductor chips may be weak bonded in steps 1021 and 1022 and then simultaneously strong bonded in step 1023.

While the first sub-process is occurring, and interleaved with that first sub-process, a second sub-process may include bonding chips to a second substrate, as shown in steps 1024, 1025, and 1028. These steps may be performed in substantially the same way as the steps of the first sub-process. However, in one embodiment, these steps use a second carrier line 130B to perform the weak and strong bonding steps.

As can be seen by FIG. 10B, sequential weak bonding of a plurality of chips to a second substrate may occur at the same time, and in some embodiments, within approximately the same time period, as simultaneous strong bonding of a plurality of chips to a first substrate. In addition, strong bonding of certain chips to each substrate may occur prior to weak bonding of other chips to that same substrate.

Although the method of FIGS. 10A and 10B is described with reference to certain exemplary embodiments, this method may be used for any of the embodiments described previously in connection, for example, with FIGS. 1-6.

While this disclosure has been particularly shown and described with reference to exemplary embodiments thereof, it will be understood that various changes in form and details may be made therein without departing from the spirit and scope of the following claims.

What is claimed is:

1. A method of manufacturing a semiconductor device, the method comprising:
providing a first substrate that includes internal wiring, the first substrate including an array of chip mounting regions that includes a first chip mounting region;
placing the first substrate on a first carrier line;
providing a first semiconductor chip;
placing the first semiconductor chip on a first moveable tray;
positioning the first substrate on the carrier line and positioning the first moveable tray to vertically align the first chip mounting region of the first substrate with the first semiconductor chip;
when the first chip mounting region of the first substrate is aligned with the first semiconductor chip, performing initial bonding of the first semiconductor chip to the first chip mounting region of the first substrate; and
subsequent to the initial bonding, performing subsequent bonding on the initially-bonded first semiconductor chip and first mounting region of the first substrate, thereby more strongly bonding the first semiconductor chip to the first substrate at the first mounting region,
wherein the initial bonding occurs after performing a subsequent bonding of at least one other semiconductor chip on the first substrate.

2. The method of claim 1, further comprising:
singulating the subsequent-bonded first semiconductor chip and first mounting region of the first substrate to form a semiconductor package device.

3. The method of claim 2, further comprising:
additionally encapsulating the first semiconductor chip to form the semiconductor package device.

4. The method of claim 1, further comprising:
providing a second semiconductor chip;
after performing initial bonding of the first semiconductor chip to the first substrate and before performing the subsequent bonding of the first semiconductor chip to the first substrate:
vertically aligning a second chip mounting region of the first substrate with the second semiconductor chip; and
performing initial bonding of the second semiconductor chip to the second chip mounting region of the first substrate; and
after performing initial bonding of the second semiconductor chip to the second chip mounting region of the first substrate, performing subsequent bonding on the initially-bonded second semiconductor chip and second mounting region of the first substrate, thereby more strongly bonding the second semiconductor chip to the first substrate at the second mounting region,
wherein the subsequent bonding of the initially-bonded first semiconductor chip and the subsequent bonding of the initially-bonded second semiconductor chip occur at the same time.

5. The method of claim 4, further comprising:
providing a third semiconductor chip;
after performing the subsequent bonding of the first semiconductor chip and second semiconductor chip to the first substrate:
vertically aligning a third chip mounting region of the first substrate with the third semiconductor chip; and
performing initial bonding of the third semiconductor chip to the third chip mounting region of the first substrate.

6. The method of claim 5, wherein the first and second chip mounting regions of the first substrate are in a first column of the array, and the third chip mounting region of the first substrate is in a second column of the array adjacent to the first column.

7. The method of claim 6, further comprising:
providing a second substrate that includes internal wiring, the second substrate including an array of chip mounting regions that includes a fourth chip mounting region;
placing the second substrate on a second carrier line adjacent the first carrier line;
providing a fourth semiconductor chip;
performing initial bonding of the fourth semiconductor chip to the fourth chip mounting region of the second substrate at the same time as performing the subsequent bonding of the first and second semiconductor chips; and
performing a subsequent bonding on the initially-bonded fourth semiconductor chip and fourth chip mounting region of the second substrate at the same time as performing initial bonding of the third semiconductor chip to the third chip mounting region of the first substrate.

8. The method of claim 7, further comprising:
using the same moveable tray to position all four of the first through fourth semiconductor chips on their respective chip mounting regions.

9. The method of claim 1, further comprising:
providing a second substrate that includes internal wiring, the second substrate including an array of chip mounting regions that includes a second chip mounting region;
placing the second substrate on a second carrier line adjacent the first carrier line;
providing a second semiconductor chip; and
performing initial bonding of the second semiconductor chip to the second chip mounting region of the second substrate at the same time as performing the subsequent bonding of the first semiconductor chip and the first chip mounting region of the first chip mounting region.

10. A method of manufacturing a semiconductor device, the method comprising:
providing a first substrate that includes internal wiring, the first substrate including an array of chip mounting regions that includes a first column including a plurality of first chip mounting regions;
providing a plurality of first semiconductor chips and at least one second semiconductor chip;
performing a first weak bonding step of bonding each of the plurality of first semiconductor chips to a respective first chip mounting region, the bond for each chip having a first strength;
subsequent to the first weak bonding step, performing strong bonding on the weak bonded plurality of first semiconductor chips and their respective first mounting regions simultaneously, such that the bond for each of the plurality of first semiconductor chips to the first substrate has a second strength stronger than the first strength; and
subsequent to performing the strong bonding on the plurality of first semiconductor chips, performing a second weak bonding step of weak bonding the at least one second semiconductor chip to at least one respective second chip mounting region of the first substrate.

11. The method of claim 10, further comprising:
singulating one of the first strong-bonded semiconductor chips and its respective mounting region of the first substrate to form a semiconductor package device.

12. The method of claim 10, further comprising:
providing a second substrate that includes internal wiring, the second substrate including an array of chip mounting regions that includes a third chip mounting region;
providing a third semiconductor chip; and
weak bonding the third semiconductor chip to the third chip mounting region of the second substrate at the same time as performing the strong bonding of the plurality of first semiconductor chips.

13. The method of claim 12, further comprising:
using a same moveable tray to position all of the first through third semiconductor chips on their respective chip mounting regions.

14. The method of claim 13, further comprising:
for each of the first semiconductor chips, weak bonding the first semiconductor chip to its respective first chip mounting region by positioning a chip tray connected to the first semiconductor chip to align the first chip with the respective first chip mounting area,
wherein the first substrate is positioned along a first carrier line to perform the aligning.

15. The method of claim 10, wherein the at least one second semiconductor chip is a plurality of second semiconductor chips, and performing the second weak bonding step includes weak bonding the plurality of second semiconductor chips to a plurality of respective second chip mounting regions of the first substrate arranged in a second column of the array.

16. A method of manufacturing a semiconductor device, the method comprising:
providing a first substrate that includes internal wiring, the first substrate including an array of chip mounting regions that includes a first column including a plurality of first chip mounting regions, and a second column including a plurality of second chip mounting regions;
providing a plurality of first semiconductor chips and a plurality of second semiconductor chips;
performing a first bonding step causing each of the plurality of first semiconductor chips to bond on their respective first chip mounting regions, the bond having a first bond strength;
subsequent to the first bonding step, performing a second bonding step on each of the first-bonded plurality of first semiconductor chips simultaneously, thereby causing each of the plurality of first semiconductor chips to bond with a second bond strength on their respective first chip mounting regions, the second bond strength stronger than the first bond strength; and
subsequent to performing the second bonding step on the plurality of first-bonded semiconductor chips, performing a third bonding step causing each of the plurality of second semiconductor chips to bond on their respective second chip mounting regions, the bond having the first bond strength.

17. The method of claim 16, wherein the first bonding step bonds each of the plurality of first semiconductor chips to the first substrate at a respective first chip mounting region, and the third bonding step bonds each of the plurality of second semiconductor chips to the first substrate at a respective second chip mounting region.

18. The method of claim 17, wherein the first bonding step bonds each of the plurality of first semiconductor chips to a lower semiconductor chip at a respective first chip mounting region, and the third bonding step bonds each of the plurality of second semiconductor chips to a lower semiconductor chip at a respective second chip mounting region.

19. The method of claim 16, wherein the first bond strength is caused by the first bonding step occurring for a first period of time, and the second bond strength is caused the second bonding step occurring for a second period of time longer than the first period of time.

20. The method of claim 16, further comprising:
singulating one of the first second-bonded semiconductor chips and its respective mounting region of the first substrate to form a semiconductor package device.

* * * * *